United States Patent
Lee et al.

(10) Patent No.: US 6,611,460 B2
(45) Date of Patent: Aug. 26, 2003

(54) NONVOLATILE SEMICONDUCTOR MEMORY DEVICE AND PROGRAMMING METHOD THEREOF

(75) Inventors: Yeong-Taek Lee, Seoul (KR); Young-Ho Lim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/131,424

(22) Filed: Apr. 22, 2002

(65) Prior Publication Data

US 2002/0191443 A1 Dec. 19, 2002

(30) Foreign Application Priority Data

Jun. 16, 2001 (KR) ........................................ 2001-34188

(51) Int. Cl.$^7$ .............................................. G11C 16/04
(52) U.S. Cl. ............................ 365/185.18; 365/185.17; 365/185.23
(58) Field of Search ...................... 365/185.18, 185.17, 365/185.23, 189.11, 189.07

(56) References Cited

U.S. PATENT DOCUMENTS

| | | | |
|---|---|---|---|
| 5,677,873 A | 10/1997 | Choi et al. | |
| 5,748,536 A | 5/1998 | Kwon et al. | |
| 5,768,188 A | 6/1998 | Park et al. | |
| 5,991,202 A | 11/1999 | Derhacohbian et al. | |
| 6,166,951 A | * 12/2000 | Derhacobian et al. | . 365/185.17 |
| 6,330,697 B1 | * 12/2001 | Clinton et al. | ............. 714/721 |
| 6,426,894 B1 | * 7/2002 | Hirano | .................. 365/185.18 |

* cited by examiner

Primary Examiner—Huan Hoang
(74) Attorney, Agent, or Firm—Marger Johnson & McCollom, P.C.

(57) ABSTRACT

A nonvolatile semiconductor memory device of the present invention has a well voltage detecting circuit. The well voltage detecting circuit detects whether a pocket p-type well voltage is equal to or is lower than a detection voltage (e.g., 0.1V) and outputs a detection signal at a high or low level. When the pocket p-type well voltage is identical to or lower than the detection voltage, a word line select signal generating circuit generates row select signals of respective rows in response to the detection signal. With this device, in case a well voltage of the pocket p-type well is increased due to applying a voltage into an unselected bit line, program and pass voltages are supplied to word lines at a point of time when the increased well voltage becomes lower than the detection voltage of the well voltage detecting circuit.

19 Claims, 11 Drawing Sheets

Fig. 1

(Prior Art)

(☒ : Metal-to-Pocket P-well Contact)

| Array Size | 4200μm x 1112μm |
|---|---|
| Cell Number | 64M |
| Resistance of a Pocket P-type Well | 2KΩ /□ |
| Substrate Capacitane | 4.9nF |
| Bit Line Number | 4K |
| Bit Line-to-Pocket P-well Capacitance | 1.9nF |

NONVOLATILE SEMICONDUCTOR MEMORY DEVICE AND PROGRAMMING METHOD THEREOF

RELATED APPLICATION

This application relies from priority upon Korean Patent Application No. 2001-034188, filed on Jun. 16, 2001, the contents of which are herein incorporated by reference in their entirety.

FIELD OF THE INVENTION

The present invention is related to nonvolatile storage devices. In particular, the present invention is related to a NAND-type flash memory device that is capable of preventing program disturbance due to bouncing of a substrate voltage occurring during a bit line setup period.

BACKGROUND OF THE INVENTION

Recently, there has been increased a need for memory devices that are capable of being electrically erased and programmed without refreshing stored data. The trend is to increase capacity and integration of memory devices. A NAND-type flash memory device provides large capacity and high integration without refresh for stored data. Since the NAND-type flash memory device maintains data even at power-off, it has been applied widely to electronic equipments (e.g., handheld terminals, portable computers, etc.) where power may be suddenly interrupted.

A nonvolatile semiconductor memory device such as a NAND-type flash memory device includes electrically erasable programmable read-only memory cells, which are named "flash EEPROM cells". Typically a flash EEPROM cell includes a cell transistor or a floating gate transistor. The transistor is formed in or on a pocket p-type well as a substrate and has n-type source and drain spaced apart from each other, a floating gate placed over a channel between the source and the drain and storing charges, and a control gate placed over the floating gate.

Figure 1:
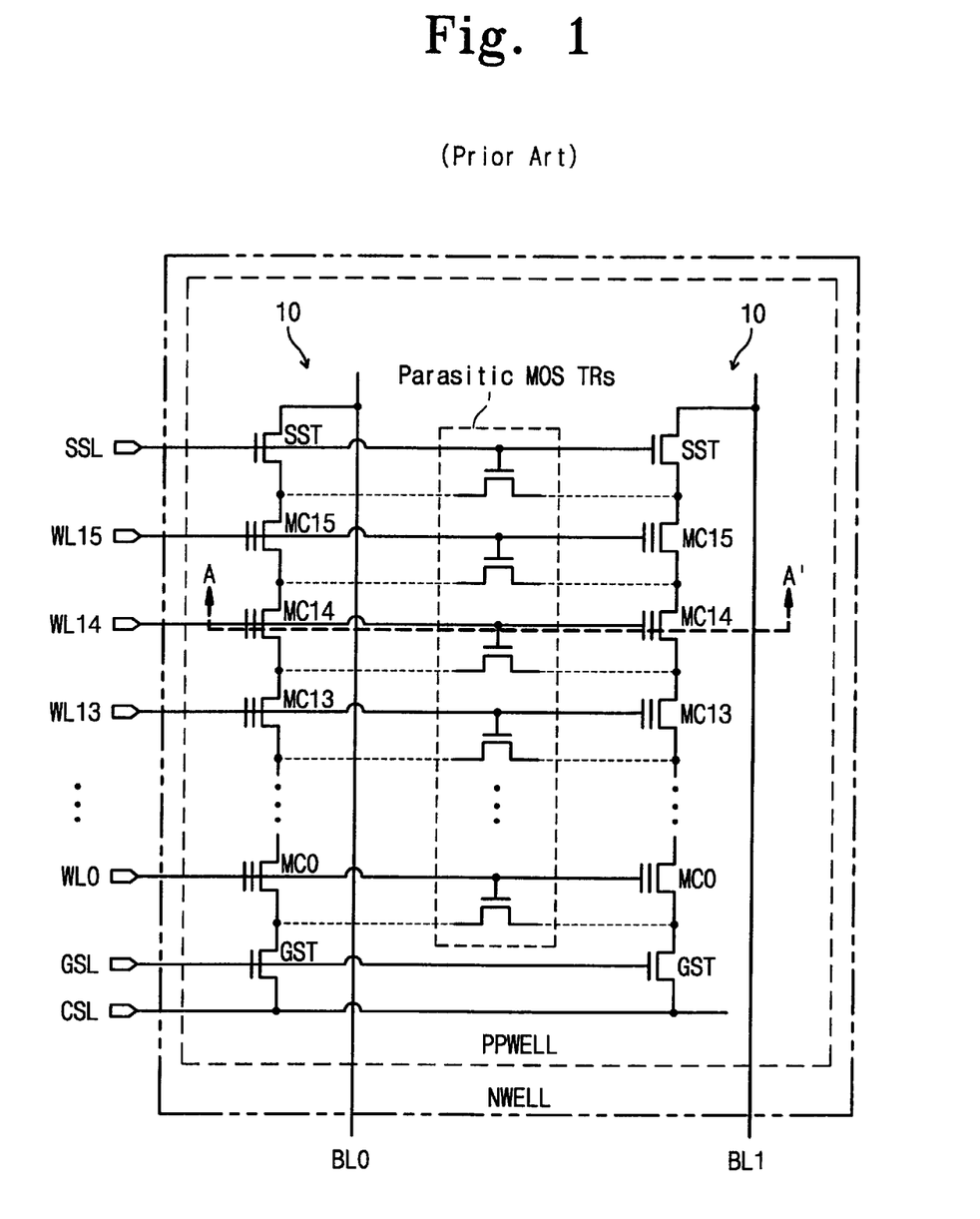
FIG. 1 is a schematic diagram showing an array structure of a conventional NAND-type flash memory device.

An array structure of a well-known NAND-type flash memory device is shown in FIG. 1. Referring to FIG. 1, a memory cell array is formed in or on a pocket p-type well PPWELL, and includes a plurality of cell strings 10 each corresponding to bit lines. The pocket p-type well PPWELL is formed in an n-type well NWELL that is formed on or in a p-type semiconductor substrate. For convenience, two bit lines BL0 and BL1 and two cell strings 10 corresponding thereto are illustrated in FIG. 1. Each cell string 10 includes a string select transistor SST as a first select transistor, a ground select transistor GST as a second select transistor, and a plurality of flash EEPROM cells MCm (m=0–15) serially connected between the string select transistor SST and the ground select transistor GST. The string select transistor SST has its drain connected to a corresponding bit line and its gate connected to a string select line SSL, and the ground select transistor GST has its source connected to a common source line CSL and its gate connected to a ground select line GSL. The flash EEPROM cells MC15 to MC0 are connected in series between a source of the string select transistor SST and a drain of the ground select transistor GST, and are respectively connected to corresponding word lines WL15 to WL0.

Before programming, all flash EEPROM cells in a memory cell array are simultaneously erased so as to have a threshold voltage of, for example, about −3V. And then, in order to program flash EEPROM cells, a program voltage Vpgm is applied to a selected word line and a pass voltage Vpass is applied respectively to unselected word lines. A threshold voltage of a cell connected to the selected word line is increased while threshold voltages of cells connected to the respective unselected word lines are not changed.

One problem arises when programming flash EEPROM cells to be programmed connected to the selected word line without programming flash EEPROM cells to be program inhibited connected to the selected word line. When the program voltage Vpgm is applied to the selected word line, it is applied both to flash EEPROM cells to be programmed and to flash EEPROM cells to be program inhibited. At this time, among the flash EEPROM cells to be program inhibited, connected to the selected word line, in particular, one or more flash EEPROM cells adjacent one to be programmed are inadvertently and undesirably programmed. This is called the "program disturb" phenomenon.

One technique for preventing the program disturb is a program inhibit method using a self-boosting scheme. The program inhibit method using the self-boosting scheme is disclosed in U.S. Pat. Nos. 5,677,873 and 5,991,202 respectively entitled "Method Of Programming Flash EEPROM Integrated Circuit Memory Devices To Prevent Inadvertent Programming Of Nondesignated And Memory Cells Therein" and "Method For Reducing Program Disturb During Self-boosting In A NAND Flash Memory", the disclosures of which are hereby incorporated by this reference.

A program inhibiting method using the self-boosting scheme is performed as follows. A ground voltage (e.g., 0V) is applied to a gate of the ground select transistor GST so as to shut off a ground path. A selected bit line (e.g., BL0) is supplied with the ground voltage, and an unselected bit line (e.g., BL1) is supplied with a power supply voltage VCC (e.g., 3.3V or 5V). Simultaneously, the power supply voltage VCC is supplied to a gate of the string select transistor SST, so that a source of the string select transistor SST (or a channel of a cell transistor to be program inhibited) is charged up to VCC-Vth (Vth is a threshold voltage of SST). At this time, the string select transistor SST is shut off. A period in which the above-described operations are performed is called "a bit line setup period".

Next, a program voltage Vpgm is applied to the selected word line and a pass voltage Vpass is applied to the respective unselected word lines, so that a channel voltage of a cell transistor to be program inhibited is boosted. The channel voltage of the cell transistor to be program inhibited, for example, is boosted up to about 8V. This causes no F-N tunneling arise to between a floating gate and a channel of the cell transistor to be program inhibited. Thus, a cell transistor to be program inhibited remains at an initial erased state. A period in which above-described operations are performed is called "a program period". If a program operation for a selected memory cell is completed, a discharge operation is carried out to discharge voltages on bit lines. The pocket p-type well PPWELL and the n-type well NWELL are grounded during the bit line setup, program and discharge periods.

With the above-described program method, a flash EEPROM cell to be program inhibited, which is adjacent to a flash EEPROM cell to be programmed, suffers from the program disturb phenomenon due to a leakage current flowing through a parasitic field transistor (or a parasitic MOS transistor) as shown in FIG. 1. This will be more fully described below.

Figure 2:
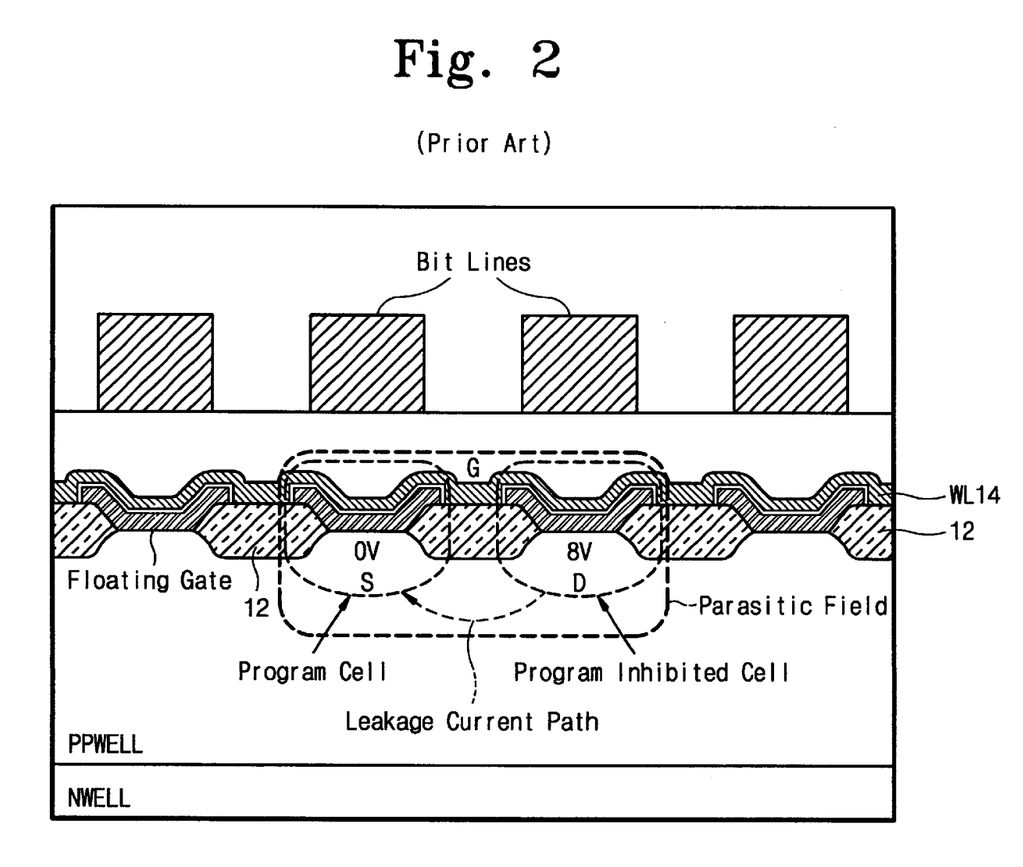
FIG. 2 is a cross sectional view taken along a dotted line A–A' in FIG. 1.

Referring to FIG. 2, which is a cross sectional view of an array structure taken along a dotted line A–A' in FIG. 1, flash EEPROM cells connected to the same word line (e.g., WL14) are electrically isolated from each other by field regions or field oxide regions 12 formed on a pocket p-type well PPWELL. In this structure, adjacent flash EEPROM cells, a word line WL14, and a pocket p-type well PPWELL collectively form a parasitic field or MOS transistor. A channel region of a cell to be program inhibited of the adjacent flash EEPROM cells acts as a drain of the parasitic field transistor, a channel region of a cell to be programmed thereof acts as a source thereof, and the word line WL14 acts as a gate thereof. The pocket p-type well PPWELL close to the field region 12 between a drain and a source of the parasitic field transistor acts as a channel of the parasitic field transistor.

In a case where the program voltage Vpgm applied to the word line WL14 is higher than a threshold voltage of a parasitic field transistor (or a threshold voltage of the parasitic field transistor is lowered), the parasitic field transistor is turned on. This causes a leakage current to flow from a channel region of a cell to be program inhibited to a cell to be programmed through the turned-on parasitic MOS transistor. Since a self-boosted channel voltage of a cell to be program inhibited is lowered, the cell to be program inhibited suffers from the program disturb phenomenon.

There are various causes for the lowering of a threshold voltage of a parasitic field transistor. One is that a voltage of a pocket p-type well PPWELL is bounced from 0V to a positive voltage when charging one or more bit lines with the power supply voltage VCC in a bit line setup period. A pocket p-type well voltage is increased through a coupling capacitor between a bit line and the pocket p-type well. For example, the coupling capacitor exists between a drain of a string select transistor contacted with a bit line and a pocket p-type well. And, the coupling capacitor exists between a bit line and a pocket p-type well. As the integration of a memory device increases, a well voltage may be increased more and more. This is because the number of bit lines simultaneously charged up to the power supply voltage VCC is increased.

Figure 3:
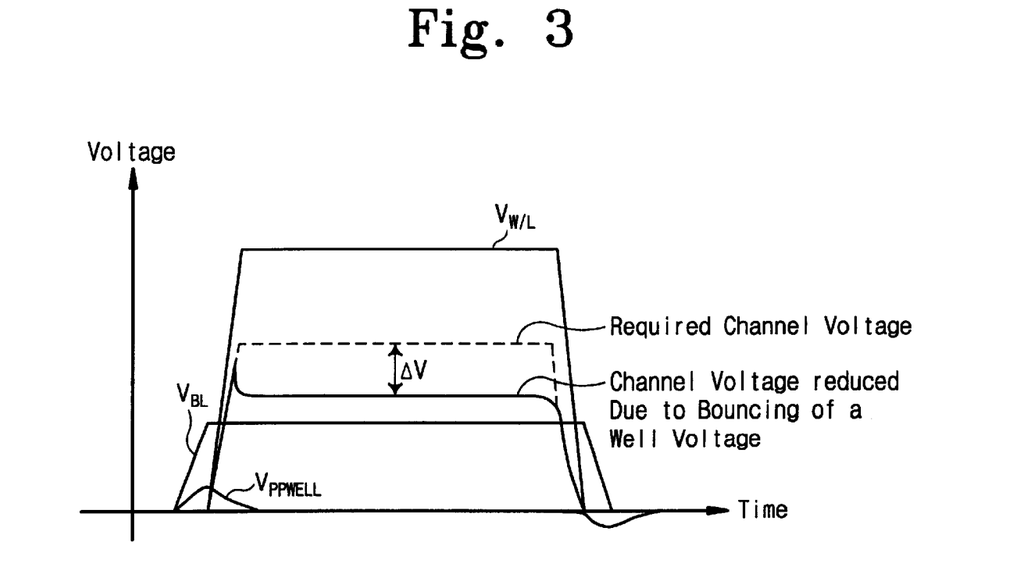
FIGS. 3 and 4 show variations of a well voltage and a channel boosting voltage according to bit line and word line enable points of time at programming.

In order to prevent the program disturb due to a leakage current flowing through the parasitic field or MOS transistor, after bit lines are charged with the power supply voltage VCC and a time elapses, word line voltages such as the program and pass voltages Vpgm and Vpass are applied to corresponding word lines. That is, after a pocket p-type well voltage VPPWELL is lowered sufficiently, the program and pass voltages are supplied to corresponding word lines. In case that a word line voltage is supplied to a word line at a state that the pocket p-type well voltage VPPWELL is not lowered sufficiently, as illustrated in FIG. 3, a channel voltage of a cell to be program inhibited is not boosted up to a required voltage (a voltage indicated by a dotted line in a figure). That is, a channel voltage is dropped by DV. A point of time when a word line voltage VWL, as shown in FIG. 4, is applied to a word line has to be delayed such that a channel voltage is sufficiently boosted up to a required voltage.

Figure 4:
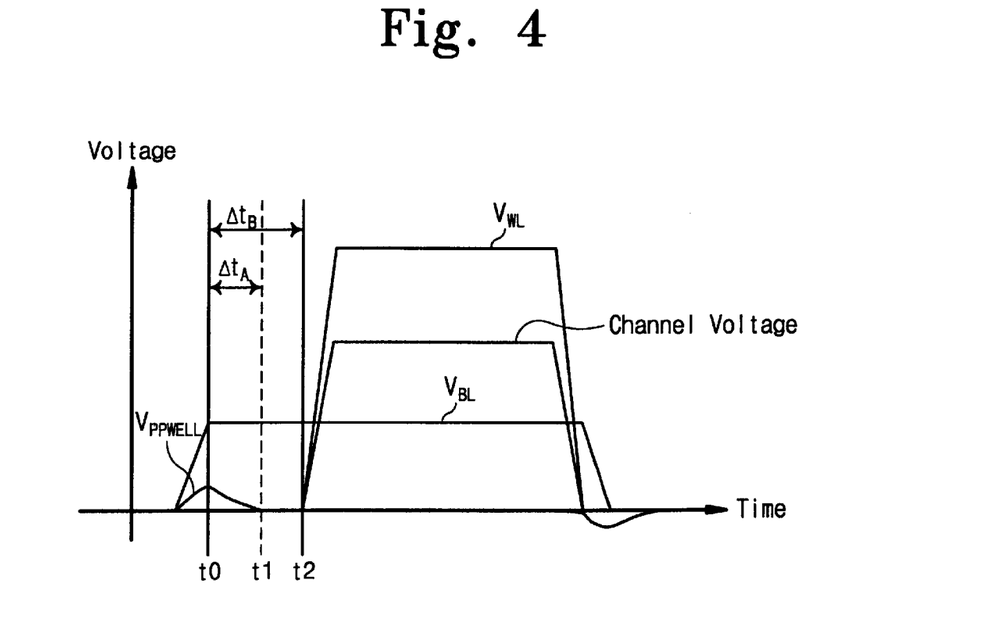

As a point of time when a word line voltage VWL is applied to a word line, a word line enable point of time is t1 in FIG. 4, at which an increased well voltage VPPWELL goes to 0V. A desirable delay time of the word line enable point of time is DtA (e.g., about 2 ms). However, since a stabilized point of time t1 of a well voltage VPPWELL is different in each memory device, it is impossible to forecast the point of time t1 exactly. For this reason, a sufficient margin DtB has to be secured between a bit line enable point of time t0 and a word line enable point of time t2. Accordingly, a total program time increases.

Increase of a program time due to a delay time of a word line enable point of time can be shortened by suppressing the bouncing of a well voltage. The bouncing of the well voltage is suppressed by reducing a resistance of the pocket p-type well PPWELL. A technique for reducing the resistance of the pocket p-type well PPWELL is a strapping technique. The strapping is to arrange metal lines over the pocket p-type well PPWELL in parallel and electrically contact the metal lines with the pocket p-well PPWELL. Such metal lines are named "strapping lines".

Figure 6:
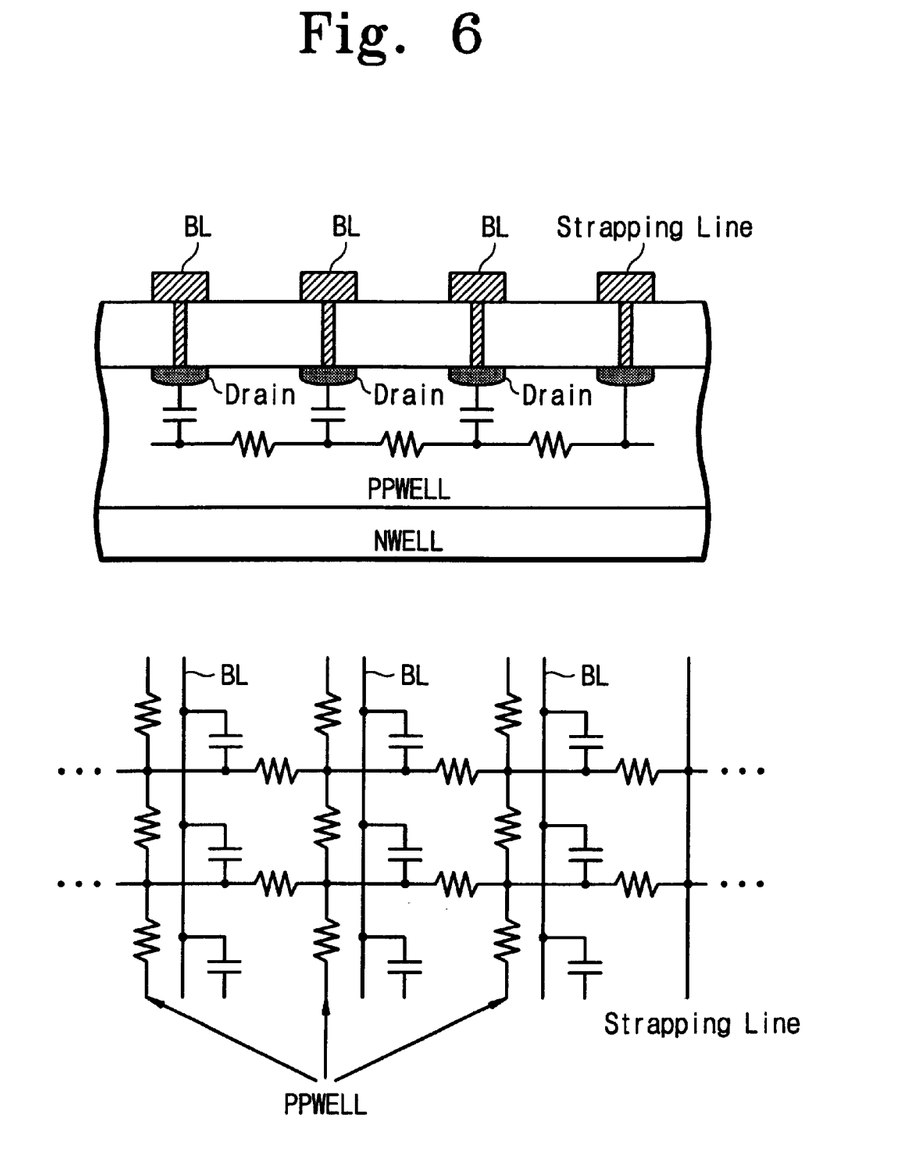
FIG. 6 is an equivalent circuit diagram of coupling capacitors existing between a pocket p-well and each bit line.
Figure 7A:
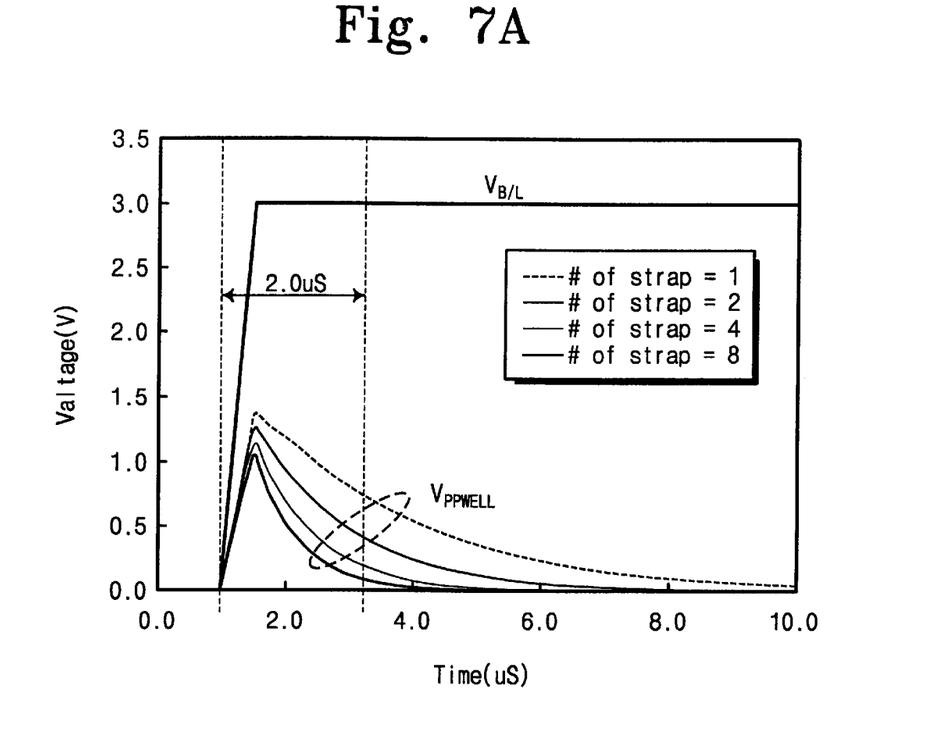
FIG. 7A shows variations of a pocket p-well voltage according to the number of strapping lines.
Figure 7B:
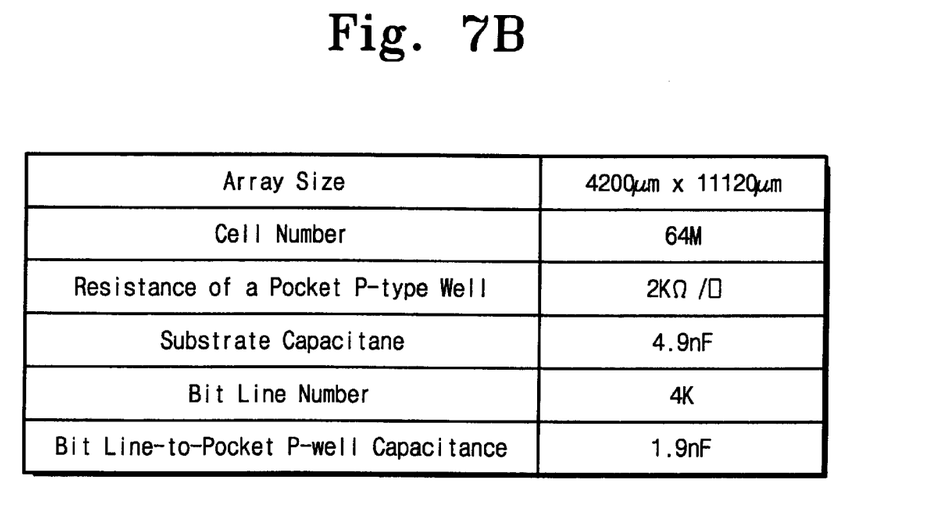
FIG. 7B is a table showing conditions used to obtain a simulation result in FIG. 7A.

In the pocket p-type well PPWELL, as illustrated in FIG. 6, there exist coupling capacitors formed between the pocket p-type well PPWELL and bit lines BL and a resistance of the pocket p-type well PPWELL. Disposing the strapping lines with large conductivity over the pocket p-type well PPWELL can reduce the resistance of the pocket p-type well PPWELL. Referring to FIG. 7A which shows a relationship between a strapping line number and a well voltage, as the number of strapping lines increases, the bouncing of a well voltage is reduced more and more. Similarly, as the number of strapping lines increases, a discharge time of a bounced well voltage is shortened more and more. A simulation result in FIG. 7A is obtained using variables illustrated in FIG. 7B. As a result, as the number of strapping lines increases, the word line enable point of time is advanced or a delay time thereof is shortened. It means that a total program time is shortened.

However, in a case where the strapping lines are disposed too much, an array size is increased in proportion to the increased number of the strapping lines, so that the chip size is increased. Bouncing of a voltage of pocket p-type well due to charging of bit lines can be reduced somewhat by the strapping lines. But, a sufficient margin or time interval is still necessary between a bit line enable point of time and a word line enable point of time.

SUMMARY OF THE INVENTION

It is therefore an object of the invention to provide a nonvolatile semiconductor memory device capable of securing an optimum program time without program disturb due to bouncing of a substrate voltage and a method for programming the device.

It is another object of the invention to provide a nonvolatile semiconductor memory device capable of exactly forecasting a point of time when a bounced well voltage is stabilized.

BRIEF DESCRIPTION OF THE DRAWINGS

A more complete appreciation of the present invention, and many of the attendant advantages thereof, will become readily apparent as the same becomes better understood by reference to the following detailed description when considered in conduction with the accompanying drawings in which like reference symbols indicate the same or similar components, wherein.

DESCRIPTION OF THE PREFERRED EMBODIMENT

The preferred embodiment of the invention will be more fully described with reference to the attached drawings.

A nonvolatile semiconductor memory device of the present invention carries out read and program operations by a page unit, and is described using a NAND-type flash memory device. The NAND-type flash memory device is fabricated using a CMOS process technique, and semiconductor elements (e.g., PMOS and NMOS transistors) forming a peripheral circuit of the device are formed on or in a p-type semiconductor substrate. If memory cells forming a memory cell array are formed on or in the p-type semiconductor substrate without a separate process, it is impossible to apply a high voltage to a substrate or bulk of memory cells during an erase operation. For this reason, the memory cell array of memory cells is formed on or in a pocket p-type well, which is formed in an n-type well formed in a p-type semiconductor substrate using a well-known ion implantation process. Such a pocket p-type well is biased with a high voltage (e.g., 20V) at the erase operation and with 0V at the read and program operations.

As described above, a voltage of the pocket p-type well is bounced when a power supply voltage is supplied to bit lines during a bit line setup period. Then, program and pass voltages are applied to corresponding word lines after the bounced well voltage is stabilized. This makes a program time increased by a time necessary for stabilizing the well voltage. Hereinafter, such a time is called "a delay time". Increase of the program time can be avoided by optimizing the indispensable delay time. The present invention, therefore, comprises a circuit configuration that is capable of optimizing a program time necessary for a program operation consisting of bit line setup, program, and discharge periods.

Figure 5:
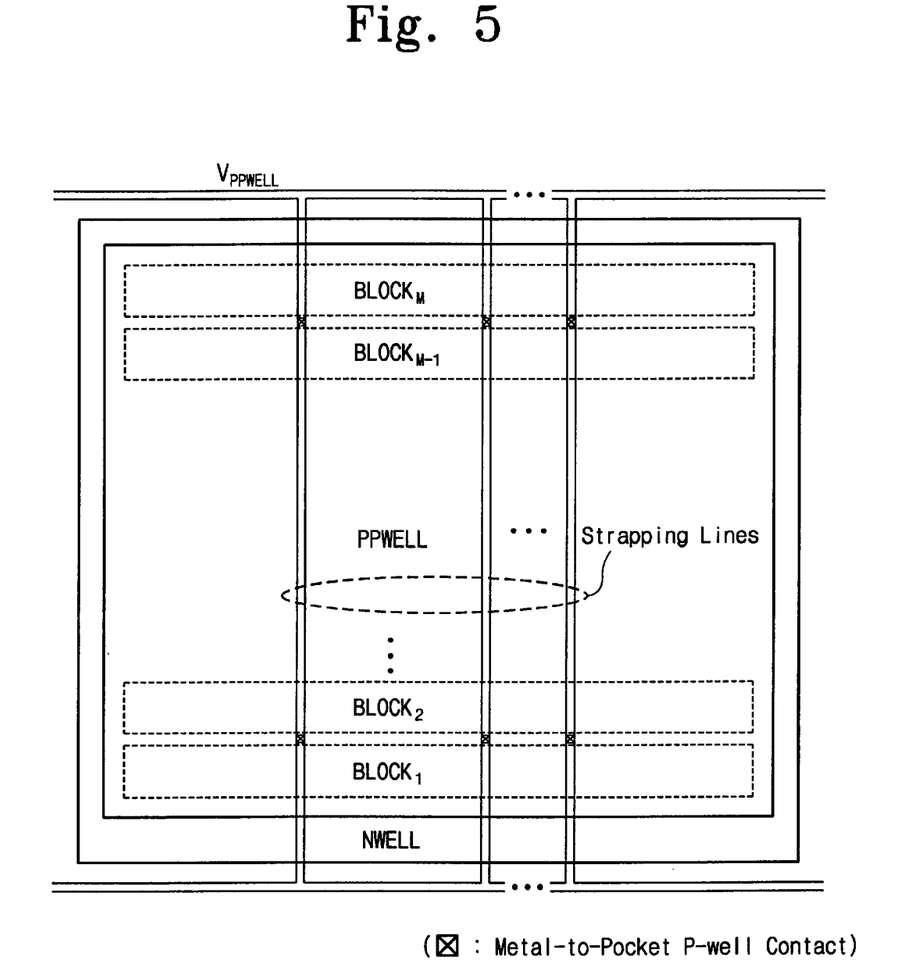
FIG. 5 is a schematic diagram showing an arrangement of strapping lines for reducing a resistance of a pocket p-well.
Figure 8:
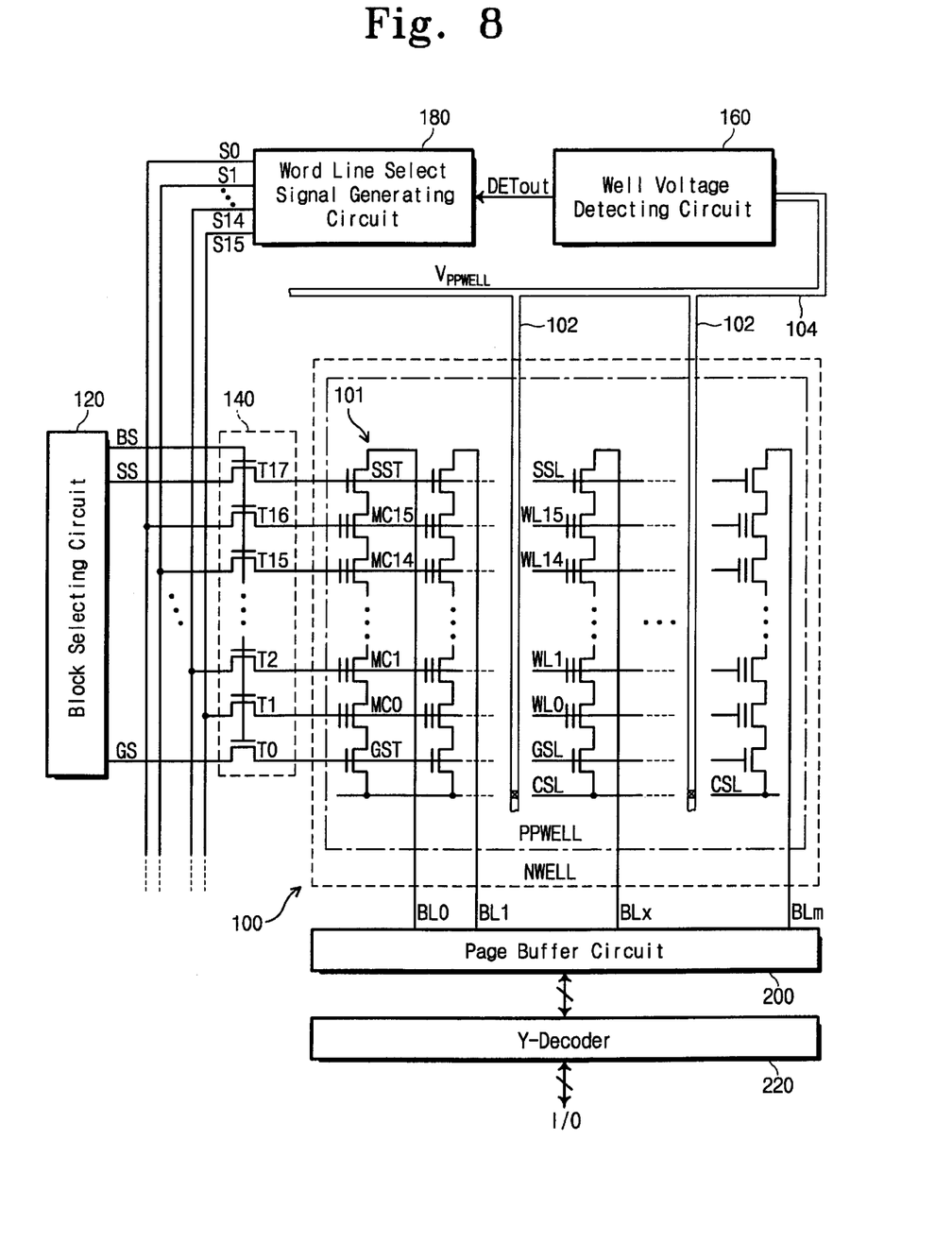
FIG. 8 is a schematic diagram of a NAND-type flash memory device according to the present invention.

FIG. 8 is a block diagram of a NAND-type flash memory device according to the present invention. Referring to FIG. 8, the NAND-type flash memory device includes a memory cell array 100 for storing data information, which is formed in a pocket p-type well PPWELL on an n-type well NWELL. The memory cell array 100 illustrated in FIG. 8 corresponds to one of plural memory blocks (refer to FIG. 5) included in the NAND-type flash memory device. In FIG. 8, also shown are a block selecting circuit 120 and a switch circuit 140 related with one memory block. All memory blocks forming the memory cell array share other constituent elements illustrated in FIG. 8.

The memory cell array 100 includes a plurality of cell strings 101 each connected to corresponding bit lines BL0–BLm. Each cell string 101 has a string select transistor SST, a ground select transistor GST, and a plurality of flash EEPROM cells MCm (m=0–15) (referred to as "memory cells") connected in series between the select transistors SST and GST. The string select transistor SST has a drain connected to a corresponding bit line and a gate connected to a string select line SSL, and the ground select transistor GST has its source connected to a common source line CSL and its gate connected to a ground select line GSL. Between a source of the string select transistor SST and a drain of the ground select transistor GST, there are serially connected the memory cells MC15–MC0, which are connected to corresponding word lines WL15–WL0, respectively.

Strapping lines 102, for supplying a well voltage $V_{PPWELL}$ to the pocket p-type well PPWELL and to reduce a resistance of the pocket p-type well PPWELL, are arranged over the pocket p-type well PPWELL. The strapping lines 102 are electrically connected or contacted with the pocket p-type well PPWELL. The strapping lines 102 are commonly connected to a well voltage supply line (or rail) 104 for transferring the well voltage $V_{PPWELL}$.

When a memory block is selected based on block address information, the block selecting circuit 120 generates a block select signal BS for selecting the memory block, a string select signal SS for selecting a string select line SSL of the selected memory block, and a ground select signal GS for selecting a ground select line GSL of the selected memory block. The switch circuit 140 includes a plurality of pass transistors T0 to T17 each corresponding to the string select line SSL, the word lines WL15 to WL0, and the ground select line GSL. The pass transistors T0 to T17 are simultaneously turned on or off by the block select signal BS from the block selecting circuit 120. The pass transistors T0 to T17 are connected so as to transfer the ground select signal GS, word line select signals S0–S15 from a word line select signal generating circuit 180, and the string select signal SS to corresponding signal lines GSL, WL0 to WL15 and SSL.

A well voltage detecting circuit 160 is connected to the well voltage supply line 104, and detects the well voltage $V_{PPWELL}$ on the well voltage supply line 104 to output a detection signal DETout as a detection result. For example, when the well voltage $V_{PPWELL}$ is over a predetermined voltage (e.g., 0.1V), the well voltage detecting circuit 160 outputs the detection signal DETout at a low level. When the well voltage $V_{PPWELL}$ is below the predetermined voltage, the well voltage detecting circuit 160 outputs the detection signal DETout at a high level. In this embodiment, a point of time when the detection signal DETout goes high is a point of time when a word line voltage is to be supplied. This means that there is no need for securing an unnecessary delay time (a time necessary for stabilizing a bounced well voltage) for a word line enable point of time. Thus, a program time can be optimized.

The word line select signal generating circuit 180 is operated according to the detection signal DETout from the well voltage detecting circuit 160, and outputs the word line select signals S0–S15 each having one of a program voltage Vpgm and a pass voltage Vpass when enabled. That is, the word line select signal generating circuit 180 is activated when the well voltage detecting circuit 160 outputs the detection signal DETout at the high level, and outputs the word line select signals S0–S15 to be transferred to corresponding word lines WL0–WL15 through the switch circuit 140.

Referring still to FIG. 8, a page buffer circuit 200 is connected to the bit lines BL0–BLm, and includes page buffers well known in the art. The page buffers are disclosed in U.S. Pat. No. 5,748,536 entitled "Data Read Circuit For A Nonvolatile Semiconductor Memory", the disclosure of which is hereby incorporated by this reference. The page buffer, at a read/verify operation, latches data stored in a selected memory cell through a corresponding bit line and outputs the latched data to a data (or input/output) line bus through a column decoder circuit (or a column selecting circuit) 220. The page buffer latches program data transferred through the column decoder circuit 220 during a program operation.

Figure 9:
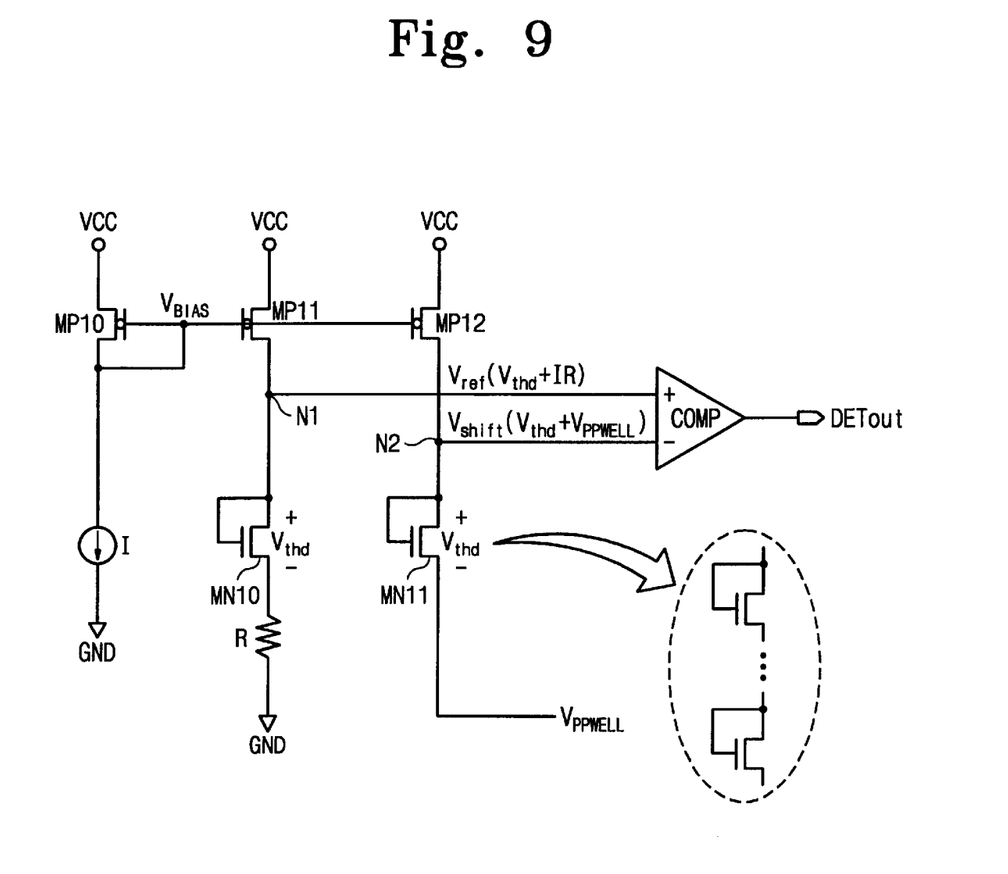
FIG. 9 is a preferred embodiment of a well voltage detecting circuit illustrated in FIG. 8.

A preferred embodiment of a well voltage detecting circuit 160 illustrated in FIG. 8 is shown in FIG. 9. The well voltage detecting circuit 160 includes three PMOS transistors MP10, MP11 and MP12, a constant current source I, a resistor R, two NMOS transistors MN10 and MN11 each acting as a diode, and a comparator COMP. The PMOS transistor MP10 whose source is connected to a power supply voltage VCC has a gate and a drain connected to each other. The current source I is connected between the drain of the PMOS transistor MP10 and a ground voltage GND. The PMOS transistor MP10 and the current source I operate as a bias circuit for outputting a bias voltage $V_{BIAS}$.

The PMOS transistor MP11 whose source is connected to the power supply voltage VCC has its gate connected to receive the bias voltage $V_{BIAS}$ and its drain connected to an N1 node. The NMOS transistor MN10 whose source is grounded has a gate and a drain connected in common to the N1 node via the resistor R. The PMOS transistor MP11, the NMOS transistor MN10 and the resistor R act as a reference voltage generator for generating a reference voltage Vref. The reference voltage Vref is identical with a sum of a voltage Vthd across the NMOS transistor MN10 and a voltage across the resistor R (Vref=Vthd+IR).

The PMOS transistor MP12 has a source connected to the power supply voltage VCC, a gate connected to the bias voltage $V_{BIAS}$, and a drain connected to an N2 node. The NMOS transistor MN11 whose source is connected to the well voltage $V_{PPWELL}$ has a drain and a gate connected in common to the N2 node. With this structure, the well voltage $V_{PPWELL}$ is increased by the voltage Vthd across the diode-connected NMOS transistor MN11, and the increased voltage Vshift appears on the N2 node. The transistors MP12 and MN11 operate as a level shifter for increasing the well voltage $V_{PPWELL}$. Since the well voltage VPPWELL to be detected is a voltage (e.g., 0.1V) close to 0V, the level shifter is used so that the comparator COMP using a differential amplifier operates normally.

The comparator COMP has a non-inverting terminal for receiving the reference voltage Vref (Vthd+IR), an inverting terminal for receiving the voltage Vshift (Vthd+$V_{PPWELL}$) on the N2 node, and an output terminal for outputting the detection signal DETout. If Vref is lower than Vshift, the comparator COMP outputs the detection signal DETout at the low level. If the Vref is higher than the Vshift, the comparator COMP outputs the detection signal DETout at the high level.

In this embodiment, the NMOS transistors MN10 and MN11 have the same size. It is understood by those skilled in the art that each NMOS transistor MN10 and MN11 can be substituted with a plurality of diode-connected NMOS transistors as illustrated by a dotted line in FIG. 9. The detection voltage of the well voltage detecting circuit 160 can be adjusted by controlling the constant current source I and the resistance of the resistor R.

Figure 10:
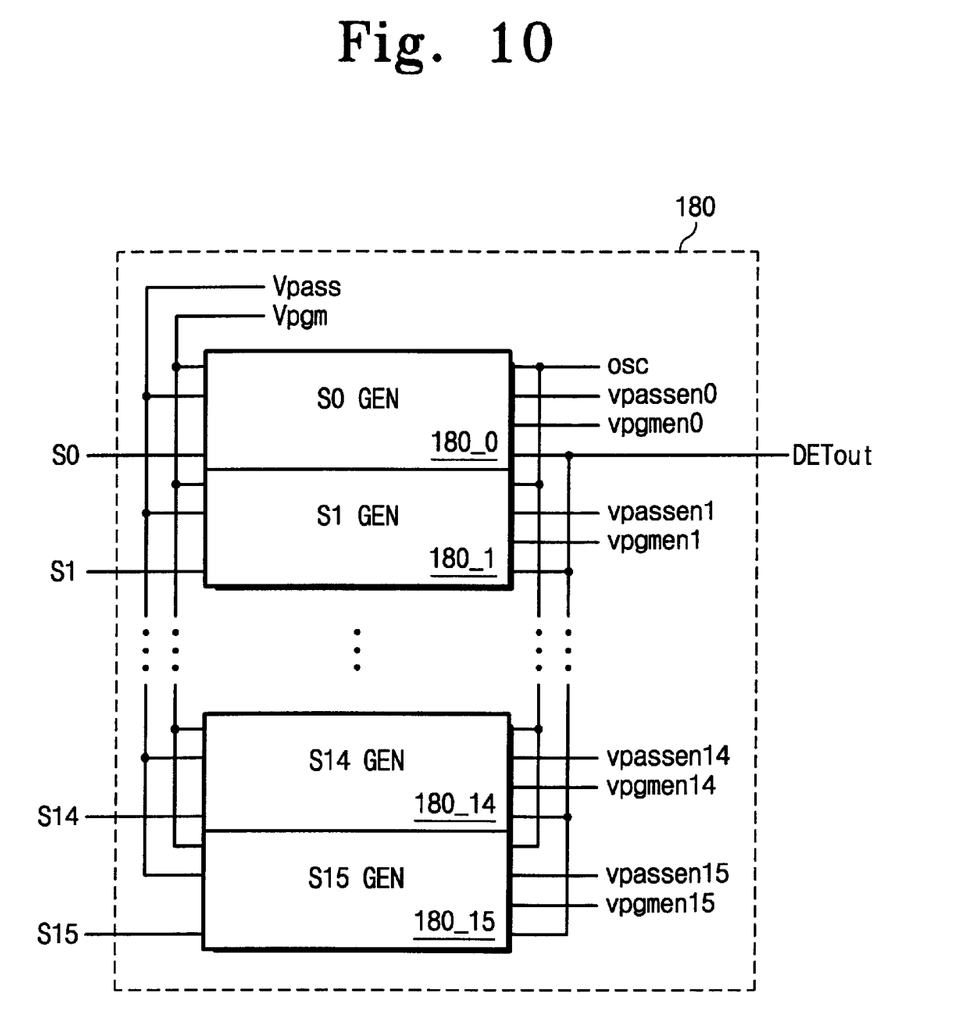
FIG. 10 is a block diagram of a word line select signal generating circuit illustrated in FIG. 8.

FIG. 10 is a block diagram of a word line select signal generating circuit illustrated in FIG. 8. As shown in FIG. 10, the word line select signal generating circuit 180 includes word line select signal generators 180_0 to 180_15 each corresponding to the word lines WL0 to WL15. A program voltage Vpgm, a pass voltage Vpass, and an oscillation signal OSC are provided in common to the signal generators 180_0 to 180_15. The program and pass voltages Vpgm and Vpass are generated through separate high voltage generators. Each of the signal generators 180_i (I=0–15) is supplied with corresponding control signals VPASSENi and VPGMENi. The signal generators 180_0 to 180_15 are simultaneously activated or inactivated by the detection signal DETout from the well voltage detecting circuit 160.

For example, when the detection signal DETout is low (or the well voltage is higher than a specific voltage), each signal generator is inactivated even though corresponding control signals VPASSENi and VPGMENi are activated. When the detection signal DETout is high (or the well voltage is lower than the specific voltage), an output signal of each signal generator has the program voltage Vpgm or the pass voltage Vpass according to an activated control signal VPASSENi or VPGMENi.

The control signals VPASSENi and VPGMENi are activated or inactivated according to decoded information of an address for selecting word lines. For example, in case of selecting a word line WL0 during a program operation, a control signal VPGMEN0 of a signal generator 180_0 corresponding to the selected word line WL0 is activated. At this time, control signals VPGMEN1 to VPGMEN15 of the signal generators 180_1 to 180_15 corresponding to other word lines WL1 to WL15 are inactivated while control signals VPASSEN1 to VPASSEN15 of the signal generators 180_1 to 180_15 are activated. This causes a word line select signal S0 of the program voltage Vpgm to be applied to the selected word line WL0 and word line select signals S1 to S15 each having the pass voltage Vpass to be applied to other word lines WL1 to WL15.

Figure 11:
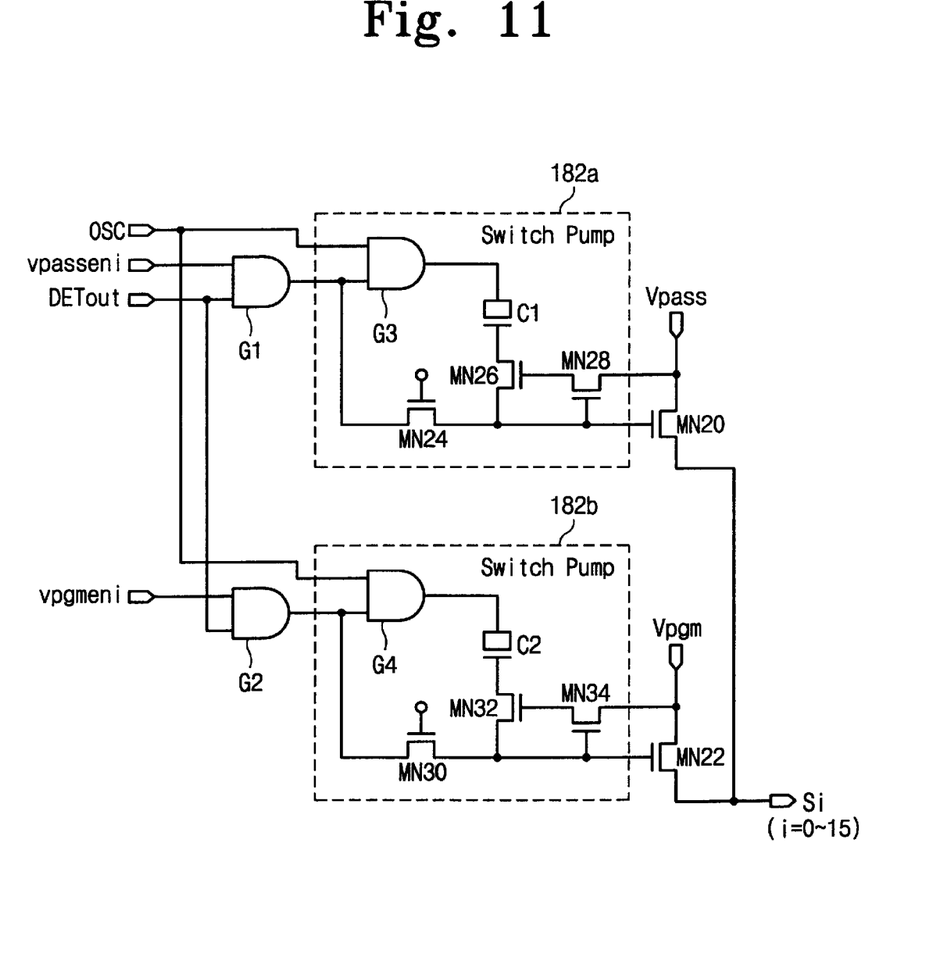
FIG. 11 is a preferred embodiment of a word line select signal generating circuit illustrated in FIG. 10.

An embodiment of each word line select signal generator for performing the above-described functions is illustrated in FIG. 11. Referring to FIG. 11, a word line select signal generator 180_i includes two NAND gates G1 and G2, two NMOS transistors MN20 and MN22, and two switch pumps 182a and 182b. When the detection signal DETout is low (or a well voltage is higher than a specific voltage), the switch pumps 182a and 182b are inactivated regardless of activation of control signals VPASSENi and VPGMENi. If the detection signal transitions from a low level to a high level (or the well voltage is lower than the specific voltage), the switch pumps 182a and 182b are selectively operated according to activation of the control signal VPASSENi or VPGMENi, so that the program voltage Vpgm or the pass voltage Vpass is transferred to an output terminal Si.

Figure 12:
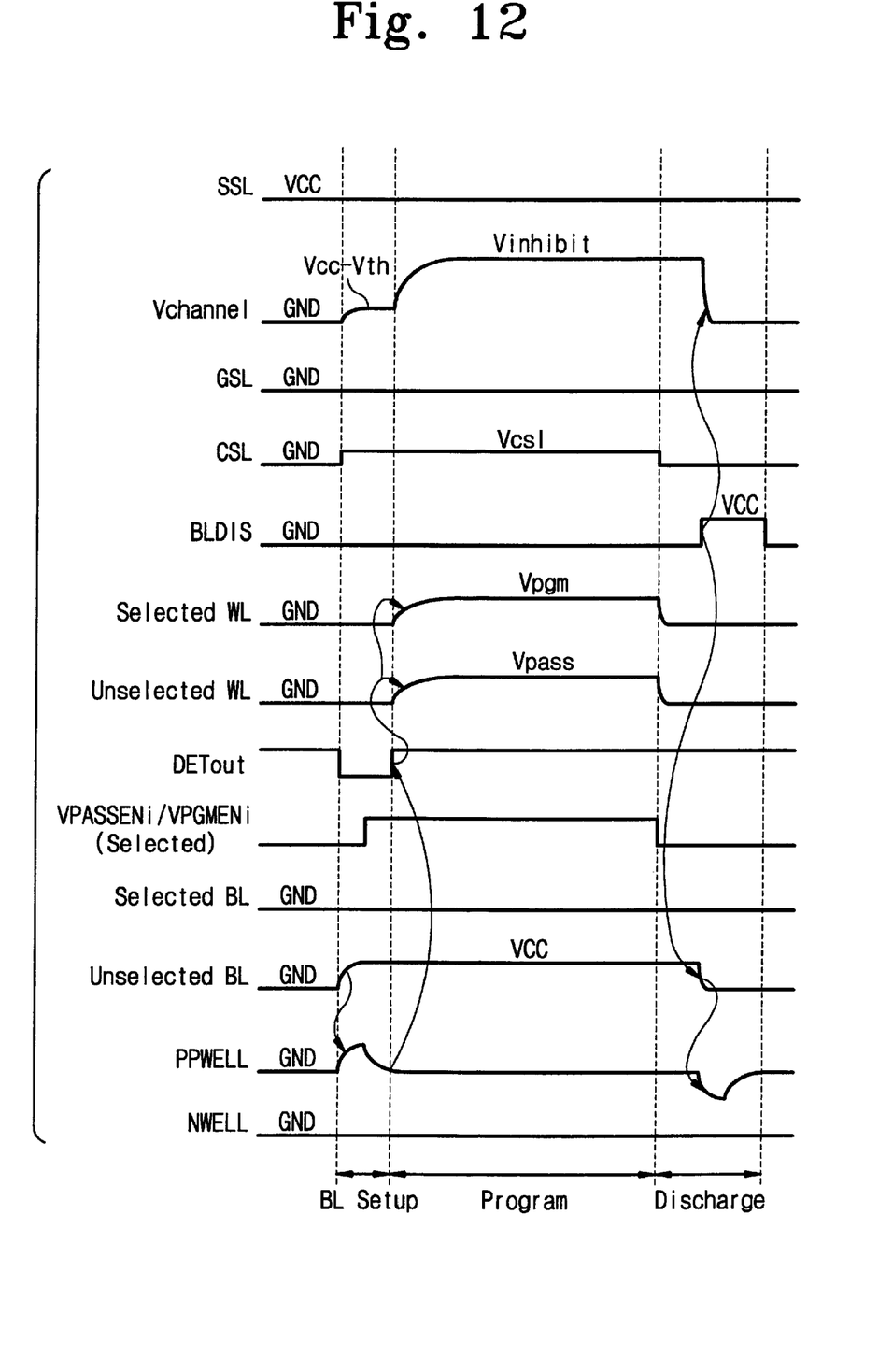
FIG. 12 is a timing diagram of a NAND-type flash memory device according to the present invention at programming.

FIG. 12 is a timing diagram of a NAND-type flash memory device according to the present invention during a program operation. A program operation of the flash memory device according to the present invention will be described with reference to the accompanying drawings.

The program operation of the flash memory device is divided into a bit line setup period, a program period, and a discharge or recovery period as described above. During the bit line setup period, a bit line is charged by a power supply voltage or a ground voltage according to a data bit loaded on a page buffer. For example, if the loaded data bit is "1", the power supply voltage is supplied to a bit line. If the load data bit is "0", the ground voltage is supplied to the bit line. Hereinafter, a bit line supplied with the ground voltage is called "a selected bit line", and a bit line supplied with the power supply voltage is called "an unselected bit line". A word line supplied with the program voltage Vpgm is called "a selected word line, and a word line supplied with the pass voltage Vpass is called "an unselected word line".

The block selecting circuit 120 responds to block select information and outputs the block select signal BS having a high voltage, the string select signal SS having the power supply voltage VCC (e.g., 3.3V or 5V), and a ground select signal GS having the ground voltage GND. The pass transistors T0 to T17 of the switch circuit 140 are simultaneously turned on by the block select signal BS, so that the string select signal SS is transferred to the string select line SSL via the turned-on pass transistor T17 and the ground select signal GS is transferred to the ground select line GSL via the turned-on pass transistor T0. As the ground voltage GND is applied to the gate of the ground select transistor GST, a ground path is shut off.

Continuously, the ground voltage GND (e.g., 0V) is applied to one or more selected bit lines, and the power supply voltage VCC of 3.3V or 5V is applied to one or more unselected bit lines. When the power supply voltage VCC is applied to the unselected bit line, as shown in FIG. 12, a voltage of the pocket p-type well PPWELL is bounced over 0V through coupling capacitors between the unselected bit line(s) and the pocket p-type well PPWELL. At this time, although control signals VPASSENi and VPGMENi applied to the word line select signal generating circuit 180 are activated by word line select information, the program and pass voltages Vpgm and Vpass are not applied to the word line select signals S0 to S15. This is because the detection signal DETout from the well voltage detecting circuit 160 is maintained low (or because the bounced well voltage is higher than a specific detection voltage).

The well voltage $V_{PPWELL}$ bounced by applying of a voltage into the unselected bit line is lowered toward 0V as a time elapses. When the well voltage $V_{PPWELL}$ is lowered below the detection voltage (e.g., 0.1V) of the well voltage detecting circuit 160, the detection signal DETout transitions from a low level to a high level. The signal generators 180_0 to 180_15 are activated according to a low-to-high transition of the detection signal DETout, so that a word line select signal of the program voltage Vpgm is applied to the selected word line and a word line select signal of the pass voltage Vpass is applied respectively to the unselected word lines.

Since the power supply voltage is applied to the gate of the string select transistor SST connected to the unselected bit line(s), a voltage of VCC-Vth (Vth is a threshold voltage of the string select transistor) is charged at the source of the string select transistor SST or at a channel of a program-inhibited cell transistor. At this time, the string select transistor SST is shut off or turned off.

In this state, as the program voltage Vpgm is applied to the selected word line and the pass voltage Vpass is applied to the unselected word lines, a channel voltage Vchannel of the program-inhibited cell transistor is boosted up to, for example, about 8V, without leakage through the parasitic field transistor. This causes no F-N tunneling to arise between a floating gate and a channel of a program-inhibited cell, so that the program-inhibited cell transistor maintains an initial erased state. If the selected memory cell is programmed, voltages of the selected and unselected bit lines are discharged.

In case that the well voltage $V_{PPWELL}$ of the pocket p-type well PPWELL is bounced due to applying a voltage to unselected bit lines, the pass and program voltages Vpgm and Vpass are applied to word lines at a point of time when the bounced well voltage becomes lower than the detection voltage (e.g., 0.1V) of the well voltage detecting circuit 160. For this reason, there is no need secure an unnecessary margin for a word line enable point of time. As a result, the program disturb phenomenon due to bouncing noise of the pocket p-type well PPWELL caused at the bit line setup period is prevented. Furthermore, the delay time between the bit line setup point of time and the word line enable point of time can be optimized so that the program time is shortened or speeded up.

The present invention is described using a single-bit NAND-type flash memory device. But, it is obvious to ones skilled in the art that the present invention is applied to a multi-bit (multi-level or multi-state) NAND-type flash memory device for storing N-bit data (N is 2 or a higher value integer) per memory cell. The multi-bit NAND-type flash memory device is disclosed in U.S. Pat. No. 5,768,188 entitled "Multi-State Non-Volatile Semiconductor Memory And Method For Driving The Same" (assigned to Samsung Electronics Co., LTD.), the disclosure of which is hereby incorporated by this reference.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor memory device comprising:
    a block of memory cells arranged in rows and columns and formed in a pocket p-type well;
    a pocket p-type well voltage rail connected to the pocket p-type well, for supplying the pocket p-type well with a well voltage;
    a well voltage detecting circuit for detecting whether the pocket p-type well voltage is identical to or lower than a reference voltage during programming, to output an enable signal as a detection result; and
    a select signal generating circuit for generating row select signals corresponding to the respective rows in response to the enable signal when the pocket p-type well voltage is identical to or lower than the reference voltage.

2. The nonvolatile semiconductor memory device according to claim 1, wherein the memory cells form a plurality of cell strings each connected to corresponding bit lines, memory cells of each cell string being respectively connected to corresponding word lines.

3. The nonvolatile semiconductor memory device according to claim 2, wherein each memory cell stores single-bit data.

4. The nonvolatile semiconductor memory device according to claim 2, wherein each memory cell stores multi-bit data.

5. The nonvolatile semiconductor memory device according to claim 1, wherein one of the row select signals has a program voltage and the others have a pass voltage.

6. The nonvolatile semiconductor memory device according to claim 5, wherein the well voltage detecting circuit comprises:
    a bias circuit for generating a bias voltage;
    a level shifter operated by the bias voltage, for increasing the well voltage by a predetermined amount;

a reference voltage generator operated by the bias voltage, for generating the reference voltage; and a comparator for comparing an output of the level shifter with the reference voltage to output the enable signal as a comparison result.

7. The nonvolatile semiconductor memory device according to claim 6, wherein the level shifter comprises:

a PMOS transistor having a gate connected to receive the bias voltage, a source connected to a power supply voltage, and a drain; and an NMOS transistor having a gate and a drain tied together to the drain of the PMOS transistor and a source connected to a pocket p-type well voltage rail.

8. The nonvolatile semiconductor memory device according to claim 7, wherein the level-shifted voltage is substantially identical to a sum of a pocket p-type well voltage and a threshold voltage of the NMOS transistor.

9. The nonvolatile semiconductor memory device according to claim 7, wherein the level shifter further comprises one or more diode-connected NMOS transistors connected in series between the NMOS transistor and the pocket p-type well voltage rail.

10. The nonvolatile semiconductor memory device according to claim 6, wherein the reference voltage generator comprises:

a PMOS transistor having a source connected to a power supply voltage, a gate connected to receive the bias voltage, and a drain; and an NMOS transistor having a gate and a drain commonly coupled with the drain of the PMOS transistor and a source connected to a ground voltage through a resistor.

11. The nonvolatile semiconductor memory device according to claim 10, wherein the reference voltage is substantially identical to a sum of both a threshold voltage of the NMOS transistor and a voltage across the resistor.

12. The nonvolatile semiconductor memory device according to claim 10, wherein the reference voltage generator further comprises one or more diode-connected NMOS transistors that are serially connected between the NMOS transistor and the resistor.

13. The nonvolatile semiconductor memory device according to claim 1, wherein the reference voltage is about 0.1V.

14. The nonvolatile semiconductor memory device according to claim 7 or 10, wherein the NMOS transistor of the reference voltage generator has substantially the same size as that of the level shifter.

15. A method for writing data to a nonvolatile memory device that comprises a memory block of a plurality of cell strings each connected to corresponding bit lines, wherein each cell string has a plurality of memory cells each connected to corresponding word lines and wherein the memory cells of the memory block are integrated in a pocket p-type well formed in an n-type well, the method comprises the steps of:

charging the bit lines with either one of first and second supply voltages;

detecting a voltage of the pocket p-type well; and charging a selected one of the word lines with a program voltage and the others with a pass voltage when the voltage of the pocket p-type well is the same as or less than a reference voltage.

16. The method according to claim 15, wherein the first supply voltage is a ground voltage and the second supply voltage is a power supply voltage.

17. The method according to claim 15, wherein each memory cell stores single-bit data.

18. The method according to claim 15, wherein each memory cell stores multi-bit data.

19. The method according to claim 15, wherein the reference voltage is about 0.1V.

* * * * *